United States Patent
Qin (10) Patent No.: US 9,591,760 B2
(45) Date of Patent: Mar. 7, 2017

(54) DISPLAY PANEL

(71) Applicant: BEIJING BOE OPTOELECTRONICS TECHNOLOGY CO., LTD., Beijing (CN)

(72) Inventor: Geng Qin, Beijing (CN)

(73) Assignee: BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 662 days.

(21) Appl. No.: 13/963,219

(22) Filed: Aug. 9, 2013

(65) Prior Publication Data

US 2014/0041917 A1 Feb. 13, 2014

(30) Foreign Application Priority Data

Aug. 10, 2012 (CN) .......................... 2012 1 0285281

(51) Int. Cl.
*G02F 1/1362* (2006.01)
*G02F 1/13* (2006.01)
*H05K 1/18* (2006.01)
*H01L 27/12* (2006.01)

(52) U.S. Cl.
CPC ......... *H05K 1/18* (2013.01); *G02F 1/136259* (2013.01); *H01L 27/124* (2013.01); *G02F 2001/136263* (2013.01); *G02F 2001/136272* (2013.01); *G02F 2201/506* (2013.01)

(58) Field of Classification Search
CPC ............ G02F 1/136259; G02F 1/1309; G02F 2001/136263; G02F 2001/136272; G02F 2201/506; G09G 2330/08; Y10S 345/904; H01L 27/124; H01L 27/1244

USPC ..................... 349/42, 54, 139, 143; 345/904
See application file for complete search history.

(56) References Cited

U.S. PATENT DOCUMENTS

| | | | | |
|---|---|---|---|---|
| 4,804,953 A | * | 2/1989 | Castleberry | ........... G02F 1/1362 257/59 |
| 4,964,700 A | * | 10/1990 | Takabayashi | ....... G02F 1/13452 349/188 |
| 2011/0215319 A1 | * | 9/2011 | Yamazaki | ........... H01L 27/1225 257/43 |

FOREIGN PATENT DOCUMENTS

| | | |
|---|---|---|
| CN | 101004492 A | 7/2007 |
| JP | 10-123563 | 5/1998 |

OTHER PUBLICATIONS

First Chinese Office Action Issued May 30, 2014 Appln. No. 201210285281.0.

* cited by examiner

*Primary Examiner* — Paisley L Arendt
*Assistant Examiner* — Angela Davison
(74) *Attorney, Agent, or Firm* — Ladas & Parry LLP (57) ABSTRACT

The embodiments of the present invention relate to a display panel comprising an array substrate, wherein the array substrate comprises: gate lines connected to a gate driving module and data lines connected to a data driving module; gate line redundancy lines, corresponding to the gate lines one by one and receiving the same signal, and each of which is connected with the gate driving module at one end and with a corresponding gate line at the other end through a first control switch; and data line redundancy lines, corresponding to the data lines one by one and receiving the same signal, and each of which is connected with the data driving module at one end and with a corresponding data line at the other end through a second control switch.

4 Claims, 6 Drawing Sheets

FIG. 1

(Prior Art)

FIG. 2

(Prior Art)

DISPLAY PANEL

TECHNICAL FIELD

The embodiments of the present invention relate to a display panel.

BACKGROUND

A fabrication process of a display panel is very complex, wherein, during a fabrication process of an array substrate, various defects due to process errors will inevitably occur, wherein a disconnection defect is one kind of defect affecting the quality of the display panel and has a high occurrence rate. Therefore, to improve the yield rate of the display panel, when the disconnection defect occurs, a disconnection point need to be repaired to repair the disconnection defect.

Figure 1:
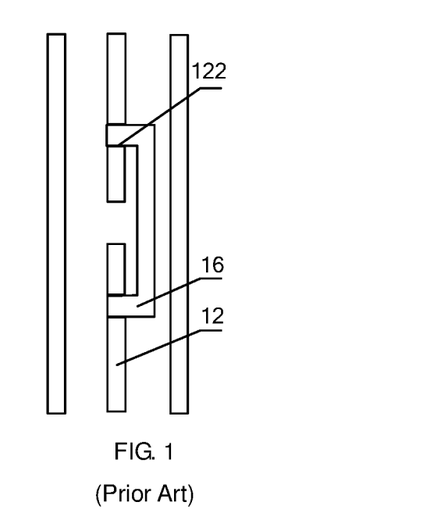
FIG. 1 is a schematic view of performing deposition to repair a disconnected line at an ARRAY terminal of an array substrate by using a CVD device in prior art.

In prior art, there are mainly two manners to repair the disconnection defect of the array substrate:

One is to use a Chemical Vapor Deposition (CVD) device at an ARRAY terminal to conduct deposition to connect a disconnected line, as shown in FIG. 1. When a disconnected line 12 is repaired, a laser can be used at the ARRAY terminal to punch a passivation layer, then a metal 16 is deposited by using the Chemical Vapor Deposition method to lead out a signal line so as to repair the disconnected line 12 through bridging.

Figure 2:
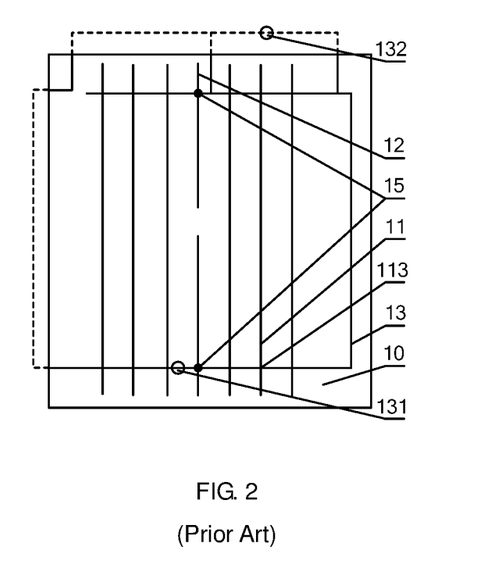
FIG. 2 is a schematic view of a structure of a repair line arranged on the array substrate in prior art.

The other method is to use at a CELL terminal a repair line, formed on an array substrate 10, for the disconnection defect of a signal line 11, as shown in FIG. 2. A laser is used at welding positions 15 where the disconnected line 12 intersects a repair line 13 to fuse the repair line 13 and the disconnected line 12, then the repair line 13 is cut off at positions 131 and 132, thereby repairing the disconnected line 12.

When the CVD device is used at the ARRAY terminal to conduct deposition to connect the disconnected line 12, as the deposited metal tungsten 16 may not be dense, especially there is too large a contact resistance at a punching connection point 122, and thus this method has a low success rate in repairing a large-sized screen.

For the method of using at the CELL terminal two repair lines 13, formed on the array substrate 10, for the disconnection defect of the signal line 11, this method has the certain repairing effect in repairing a small-sized product, however, an overlap capacitance may be generated at an intersect position 113 of the repair lines 13 and the signal lines 11, and then rendering signal delay; meanwhile, for a large-sized product. it cannot be repaired with this method, in view of the wiring situations in prior art, at most two repair lines 13 can be arranged, that is, at most two disconnected lines 12 can be repaired.

SUMMARY

Embodiments of the present invention provide a display panel to solve problems in prior art.

An embodiment of the present invention provides a display panel comprising an array substrate, and the array substrate comprising: a plurality of gate lines and a plurality of data lines each intersecting each of the plurality of data lines, each of the gate lines being connected with a gate driving module, and each of the data lines being connected with a data driving module; a plurality of gate line redundancy lines, being in a one-to-one correspondence relationship with the plurality of gate lines, and each of the gate line redundancy lines receiving the same signal as the corresponding gate line, and being connected with the gate driving module at one end and with a corresponding gate line at the other end through a first control switch; and a plurality of data line redundancy lines, being in a one-to-one correspondence relationship with the plurality of data lines, and each of the plurality of data line redundancy lines receiving the same signal as the corresponding data line, and being connected with the data driving module at one end and with a corresponding data line at the other end through a second control switch, wherein, the first control switch controls the connection and disconnection between the gate line redundancy line and the gate line being in a correspondence relationship, and the second control switch controls the connection and disconnection between the data line redundancy line and the data line being in a correspondence relationship.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

As shown in FIGS. 3-6, a display panel provided by the embodiments of the present invention comprises an array substrate, wherein, the array substrate comprises: a plurality of gate lines 65 and a plurality of data lines 74 intersecting to each other, each of the gate lines 65 is connected with a gate driving module 2, and each of the data lines 74 is connected with a data driving module 1; a plurality of gate line redundancy lines 66, corresponding to the a plurality of gate lines 65 one by one; a plurality of data line redundancy lines 77, corresponding to the plurality of data lines 74 one by one, wherein, one end of each of the gate line redundancy lines 66 is connected with the gate driving module 2 and the other end thereof is connected with a corresponding gate line 65 through a first control switch 62, and each of the gate line redundancy lines 66 receives a signal being identical with the corresponding gate line 65; one end of each of the data line redundancy lines 77 is connected with the data driving module 1 and the other end thereof is connected with a corresponding data line 74 through a second control switch 75, and each of the data line redundancy lines 77 receives a signal being identical with the corresponding data line 74, and the first control switch 62 controls the connection and disconnection between the corresponding gate line redundancy line and the corresponding gate line, and the second control switch 75 controls the connection and disconnection between the corresponding data line redundancy line and the corresponding data line.

Figure 9:
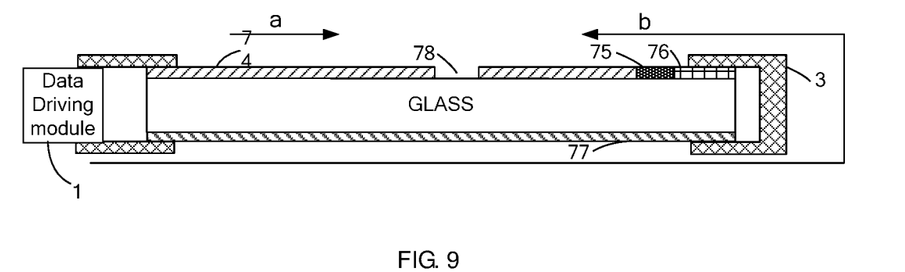
FIG. 9 is a schematic view of a signal transmission path in a display panel according to an embodiment of the present invention when a disconnection effect occurs.

Exemplarily, as shown in FIG. 9, in the display panel provided by the embodiments of the present invention, the data line redundancy lines 77 and the data lines 74 are in a one-to-one correspondence relationship and can obtain a drive signal of the data line drive module 1 at the same time, when a disconnection defect occurs in the data line 74 in one pair of data line 74 and data line redundancy line 77 corresponding to one another, the second control switch 74 can be activated, and thus, the data line 74 is connected with the other end of the data line redundancy line 77 and electrically communicated with the data line redundancy line 77, the drive signal of the data line drive module 1 can be transmitted to the other end of the data line 74 through the data line redundancy line 77, and thus it is ensured that pixels after the disconnection point of the data line 74 with the disconnection defect can also normally obtain the drive signal from the data line drive module 1.

Exemplarily, likewise, the gate line redundancy lines 66 and the gate lines 65 are in a one-to-one correspondence relationship and can obtain a drive signal of the gate line drive module 2 at the same time, when a disconnection defect occurs in the gate line 65 in one pair of gate line 65 and gate line redundancy line 66 corresponding to one another, the first control switch 62 can be activated, and thus, the gate line 65 is connected with the other end of the gate line redundancy line 66 and electrically communicated with the gate line redundancy line 66, the drive signal of the gate line drive module 2 can be transmitted to the other end of the gate line 65 through the gate line redundancy line 66, and thus it is ensured that pixels after the disconnection point of the gate line 65 with the disconnection defect can also normally obtain the drive signal from the gate line drive module 2, and in turn, the normal display of the display panel is ensured.

Because each of the data line redundancy lines 77 and each of the gate line redundancy lines 66 are used as backup lines of each of the data lines 74 and each of the gate lines 65, respectively, in a condition that a disconnection effect occurs in one of the data lines 74, the corresponding data line redundancy line 77 can used to repair the data line 74, and in a condition that a disconnection effect occurs in one of the gate lines 65, the corresponding gate line redundancy line 66 can used to repair the gate line 65. And, there is a very low rate for disconnection effects simultaneously occurring in both of the corresponding data line 74 and data line redundancy line 77 and in both of the corresponding gate line 65 and the gate line redundancy line 66.

Therefore, for the display panel provided by the embodiments of the present invention, the disconnection defect disposed on the array substrate can be repaired satisfactorily by using the disposed gate line redundancy lines 66 and the data line redundancy lines 77.

The above description only exemplarily describes the relative positions of the gate line redundancy lines 66 and the data line redundancy lines 77 with respect to the gate lines 65 and the data lines 74, however, in practice, the arrangement positions of the gate line redundancy lines 66 and the data line redundancy lines 77 can be changed according to needs.

Alternatively, the arrangement positions of the above mentioned gate line redundancy lines 66 and the data line redundancy lines 77 can have a plurality of options as follow:

Manner 1: the gate line redundancy lines 66 and the gate lines 65 are disposed at the same layer, and the data line redundancy lines 77 and the data lines 74 are disposed at the same layer, each of the gate line redundancy lines 66 and the corresponding gate line 65 are directly electrically connected with the first control switch 62 corresponding thereto, and each of the data line redundancy lines 77 and the corresponding data line 74 are directly electrically connected with the second control switch 75 corresponding thereto.

Manner 2: the gate line redundancy lines 66 and the gate lines 65 are disposed at different layers, and the data line redundancy lines 77 and the data lines 74 are disposed at different layers.

Exemplarily, there are following solutions for arranging the gate line redundancy lines and the data line redundancy lines at different layers with respective corresponding gate lines and data lines.

Figure 10:
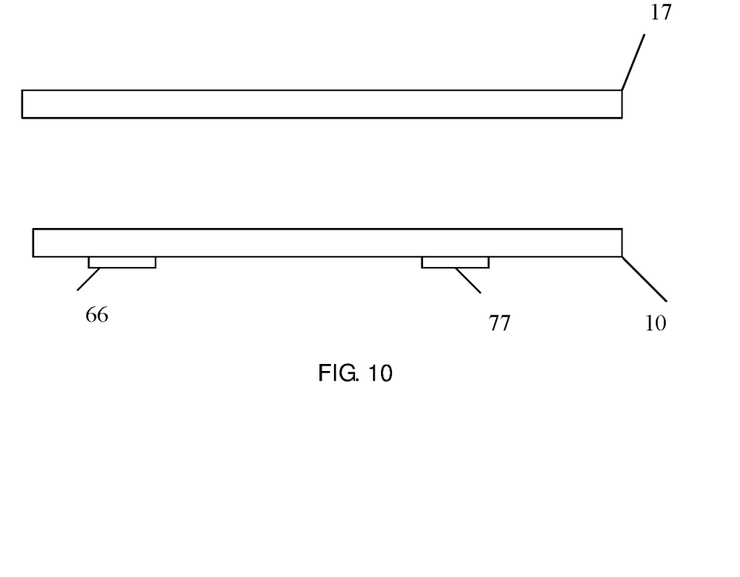
FIG. 10 is a schematic view of a wiring structure of redundancy lines in a display panel according to an embodiment of the present invention.

First, the above display panel further comprises a color filter substrate 17, and the gate line redundancy lines 66 and the data line redundancy lines 77 can be located at a side of the array substrate facing away from the color filter substrate 17, as shown in FIG. 10, each of the gate line redundancy lines 66 is electrically connected with its corresponding first control switch 62 through a first flexible circuit board 4, and each of the data line redundancy lines 77 is electrically connected with its corresponding second control switch 75 through a second flexible circuit board 3.

Figure 11:
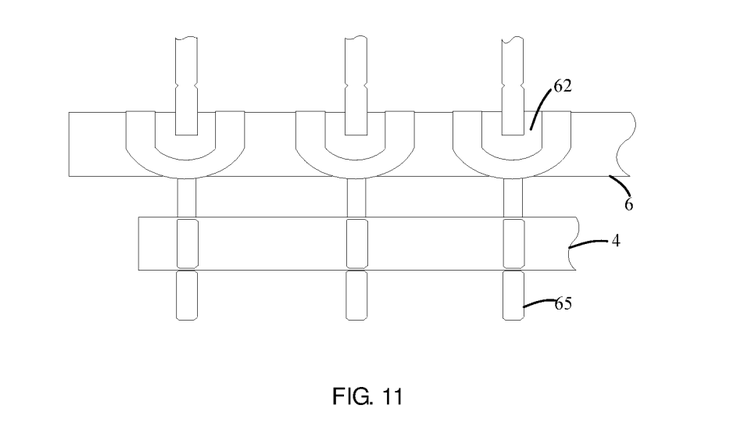
FIG. 11 is a schematic view showing a line-connection structure of a first control switch in a display panel according to an embodiment of the present invention.
Figure 12:
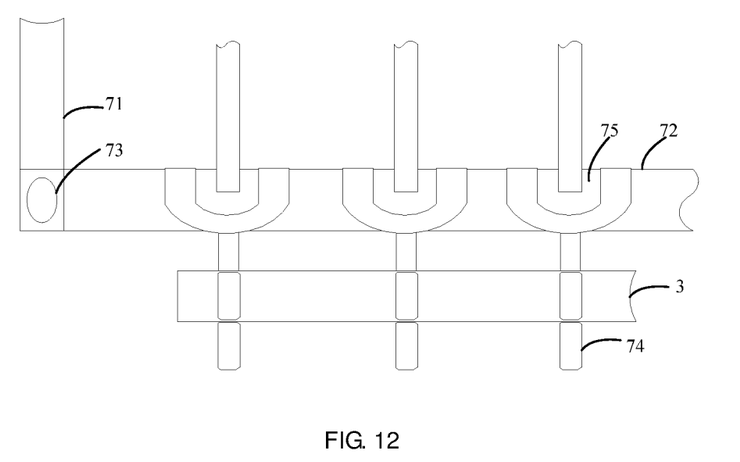
FIG. 12 is a schematic view showing a line-connection structure of a second control switch in a display panel according to an embodiment of the present invention.

Or, each of the gate lines 65 is electrically connected with its corresponding first control switch 62 through the first flexible circuit board 4, and each of the data lines 74 is electrically connected with its corresponding second control switch 75 through the second flexible circuit board 3, as shown in FIGS. 11 and 12.

Second, the above display panel further comprises a color filter substrate 17, and the gate line redundancy lines 66 and the data line redundancy lines 77 can be disposed on the color filter substrate 17, and each of the gate line redundancy lines 66 is electrically connected with its corresponding first control switch 62 through the first flexible circuit board 4, and each of the data line redundancy lines 77 is electrically connected with its corresponding second control switch 75 through the second flexible circuit board 3.

Or, each of the gate lines 65 is electrically connected with its corresponding first control switch 62 through the first flexible circuit board 4, and each of the data lines 74 is electrically connected with its corresponding second control switch 75 through the second flexible circuit board 3.

Third, the above display panel further comprises a color filter substrate 17 and a touch control screen, and the gate line redundancy lines 66 and the data line redundancy lines 77 can be disposed at a side of the touch control screen, and each of the gate line redundancy lines 66 is electrically connected with its corresponding first control switch 62 through the first flexible circuit board 4, and each of the data line redundancy lines 77 is electrically connected with its corresponding second control switch 75 through the second flexible circuit board 3.

Or, each of the gate lines 65 is electrically connected with its corresponding first control switch 62 through the first flexible circuit board 4, and each of the data lines 74 is electrically connected with its corresponding second control switch 75 through the second flexible circuit board 3.

Of course, the arrangement positions of the above gate line redundancy lines 66 and the data line redundancy lines 77 are not restricted to the above positions, as long as they do not affect the normal wirings of the data lines 74 and the gate lines 65 on the array substrate.

Furthermore, the above gate line redundancy lines 66 and the data line redundancy lines 77 can also be provided in a plurality of arrangement manners. Alternatively, the gate line redundancy lines 66 and the data line redundancy lines 77 are formed of an anisotropic conductive adhesive which is a polymer composite material having adhesiveness, insulation property, conductivity and stable property; and it is convenient to use the anisotropic conductive adhesive to perform a wiring operation.

Alternatively, to conveniently arrange the first control switch 62 and the second control switch 75, they are thin film transistors and disposed at the same layer with thin film transistors in the array substrate, for example, gate electrodes of the first and second control switches are disposed at the same layer with gate electrode of the thin film transistors, and source/drain electrodes of the first and second control switches are disposed at the same layer with source/drain electrodes of the thin film transistors.

Alternatively, the first control switch 62 and the second control switch 75 are thin film transistors and disposed at the same layer with the gate lines in the array substrate, for example, gate electrodes or source/drain electrodes of the first and second control switches are disposed at the same layer with the gate lines, and correspondingly, source/drain electrodes or gate electrodes of the first and second control switches are disposed the same layer with the data lines or are disposed at the other layer.

Alternatively, the first control switch 62 and the second control switch 75 are thin film transistors and disposed at the same layer with the data lines in the array substrate, for example, gate electrodes or source/drain electrodes of the first and second control switches are disposed at the same layer with the data lines, and correspondingly, source/drain electrodes or gate electrodes of the first and second control switches are disposed the same layer with the gate lines or are disposed at the other layer.

Alternatively, to conveniently control the first control switch 62 and the second control switch 75, the array substrate of the above display panel is further provided with: a first signal line 6 for providing a conversion signal to each of the first control switches 62 and a second signal line 7 for providing a conversion signal to each of the second control switches 75.

Specifically, when a disconnection effect occurs in one of the data lines 74 in the array substrate, the second signal line 7 is placed at a high level, so the corresponding second control switch 75 is turned on, so that the data line 74 and the corresponding data line redundancy line 77 are electrically communicated and thus, a drive signal of the data line drive module 1 are transmitted to the other end of the data line 74 through the corresponding data line redundancy line 77, and the pixels after a disconnection point of the data line 74 with a disconnection effect can normally obtain signals from the data line drive module 1 and work normally. Exemplarily, as shown in FIG. 9, when a disconnection effect occurs in one of the data lines 74, the data line 74 can provide a signal for pixels at a left side of a disconnection point 78, a transmission direction of the signal is shown by a direction a, and for pixels at a right side of the disconnection point 78, the signal can be guided to a part of the data line 74 at the right side of the disconnection point 78 through the data line redundancy line 77 corresponding to the data line 74, and thus, the signal is provided to the pixels at the right side of the disconnection point 78, and the transmission direction of the signal is shown by a direction b; likewise, when a disconnection effect occurs in one of the gate lines 65, the first signal line 6 is placed at a high level, the first control switch 62 is turned on, so that the gate line 65 and its corresponding gate line redundancy line 66 are electrically communicated and then the drive signal of the gate line drive module 2 are transmitted to the other end of the gate line 65, and the pixels after a disconnection point of the gate line 65 with the disconnection effect can obtain the drive signal of the gate line drive module 2 and work normally.

Exemplarily, a part of the first signal line 6 corresponding to the first control switch 62 is a gate electrode of the first control switch 62, and a part of the second signal line 7 corresponding to the second control switch 75 is a gate electrode of the second control switch 75.

Exemplarily, to avoid a intersection between lead wires, in the array substrate, a signal source of the first signal line 6 and a signal source of the second signal line 7 are both at a side of the data line drive module 1.

Figure 3:
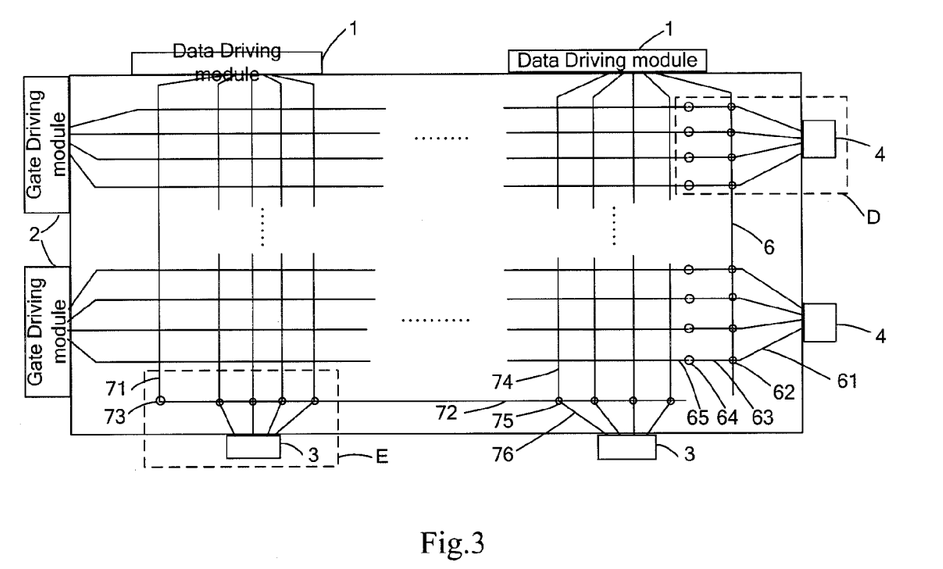
FIG. 3 is a schematic front view of a wiring structure of an array substrate in a display panel according to an embodiment of the present invention.
Figure 4:
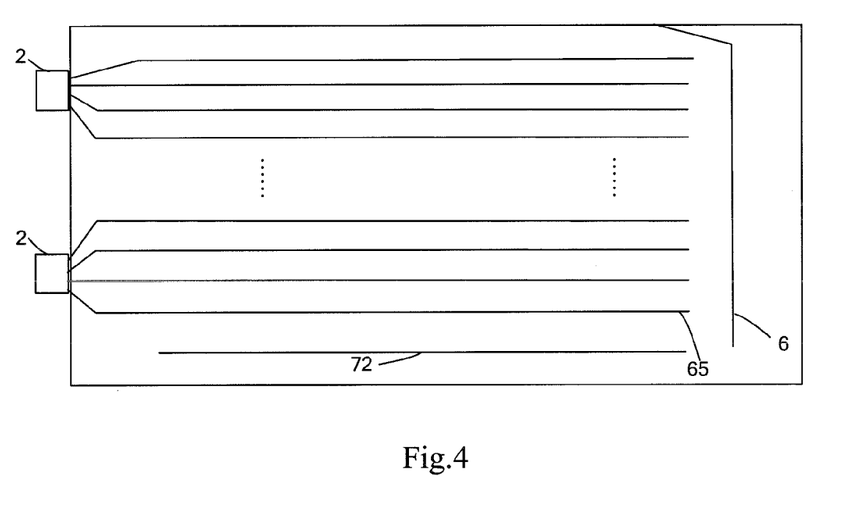
FIG. 4 is a schematic view of a wiring structure of gate lines of an array substrate in a display panel according to an embodiment of the present invention.
Figure 5:
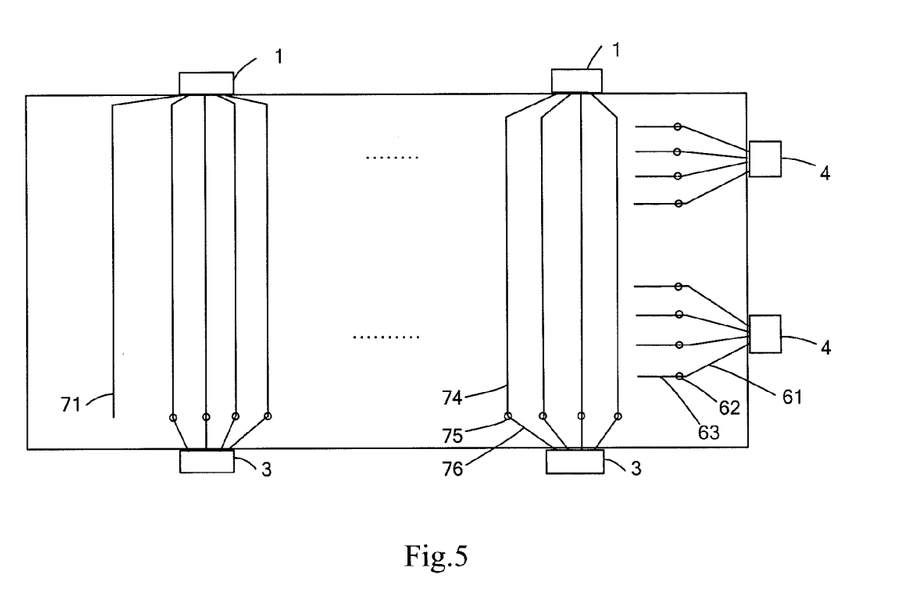
FIG. 5 is a schematic view of a wiring structure of data lines of an array substrate in a display panel according to an embodiment of the present invention.
Figure 6:
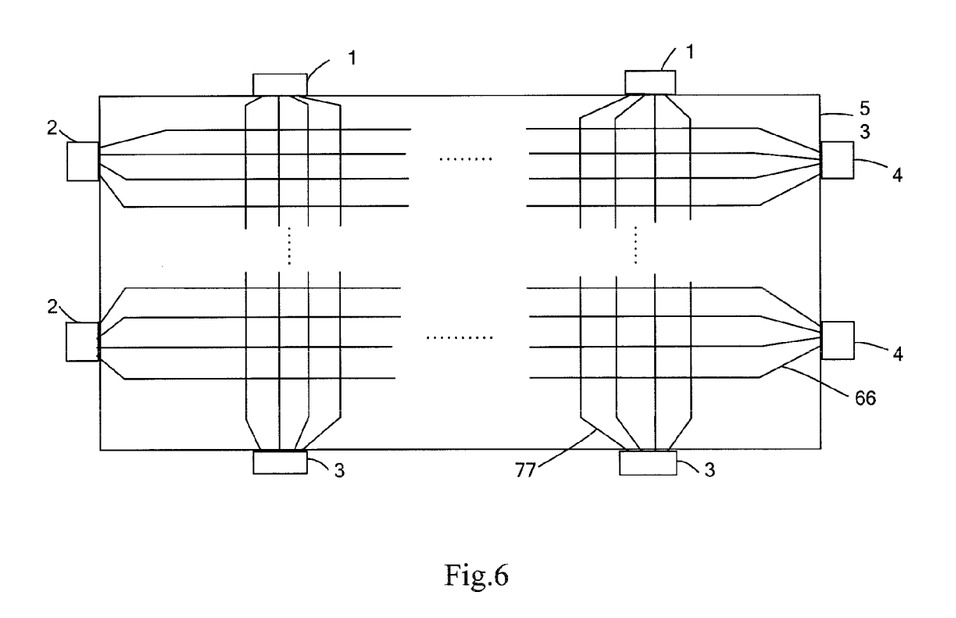
FIG. 6 is a schematic view of a wiring structure of redundancy lines in a display panel according to an embodiment of the present invention.
Figure 7:
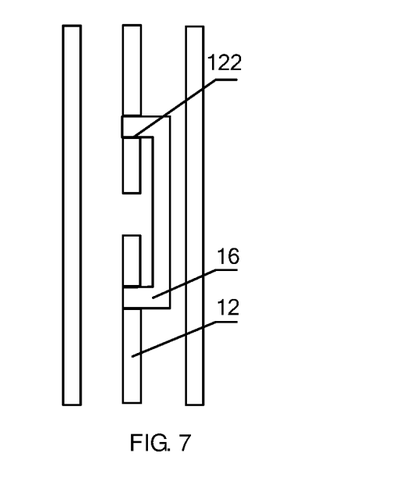
FIG. 7 is a schematic view showing a line-connection structure of a first control switch in a display panel according to an embodiment of the present invention.
Figure 8:
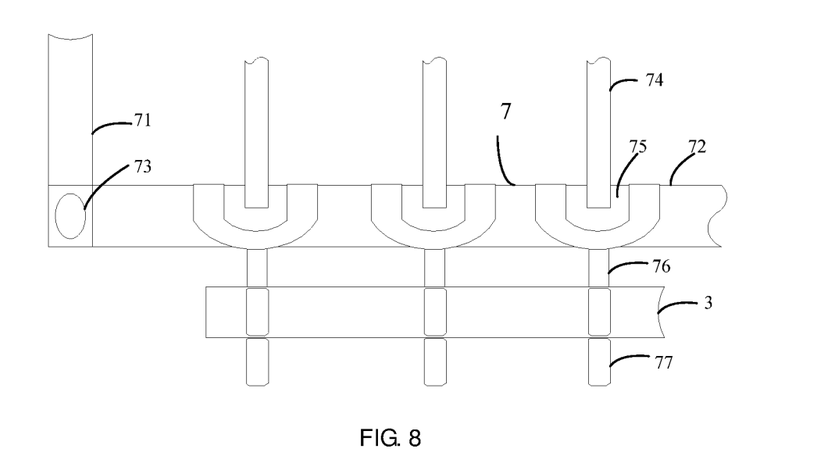
FIG. 8 is a schematic view showing a line-connection structure of a second control switch in a display panel according to an embodiment of the present invention.

The first control switch 62 and the data lines 74 are provided at the same layer, and the first control switch is electrically connected with the first flexible circuit board 4 through a first conductive electrode 61 at one end and with the corresponding gate line 65 through a gate electrode conductive electrode 63 and a through hole 64 at the other end, as shown in FIGS. 5 and 7;

The second control switch 75 and the data lines 74 are provided at the same layer, and the second control switch is electrically connected with the second flexible circuit board 3 through a second conductive electrode 76 at one end and with the corresponding data line 74 at the other end, as shown in FIG. 8;

The first signal line 6 is parallel to the data lines 74, and is disposed at the same layer with the gate lines 65, and corresponds to the first control switch 62 in position, as shown in FIGS. 3 and 4; and The second signal line 7 comprises a signal transmission line 71 parallel to and disposed at the same layer with the data lines 74, and further comprises a signal switch line 72 parallel to the gate line 65 and corresponding to the second control switch 75 in position; the signal transmission line 71 is electrically connected with the signal switch line 72 through a through hole 73, as shown in FIGS. 3, 4, 5 and 8.

Exemplarily, to avoid an intersection between lead wires, in the array substrate, a signal source of the first signal line 6 and a signal source of the second signal line 7 are both at a side of the gate line drive module 2.

The first control switch 62 and the gate lines 65 are provided at the same layer, and the first control switch is electrically connected with the first flexible circuit board through the first conductive electrode at one end and directly electrically connected with the corresponding gate line 65 at the other end;

The second control switch 75 and the gate lines 65 are provided at the same layer, and the second control switch is electrically connected with the second flexible circuit board 3 through the second conductive electrode at one end and with the corresponding data line 74 through a data line conductive electrode and a through hole at the other end;

The second signal line 7 is parallel to the gate lines, and is disposed at the same layer with the data lines, and corresponds to the second control switch in position; and The first signal line comprises a signal transmission line parallel to and disposed at the same layer with the gate lines, and further comprises a signal switch line parallel to the data line and corresponding to the first control switch in position; the signal transmission line is electrically connected with the signal switch line through a through hole.

Thus, the gate lines 65, the data lines 74, and the first control switches 62, the second control switches 75, the first signal line 6 and the second signal line 7 do not intersect one another, which prevents generation of defects such as parasitic capacitance and improves the display quality of the display panel.

In the display panel provided by the embodiments of the present invention, the gate line redundancy lines and the gate lines of a gate layer are in a one-to-one correspondence relationship and can obtain the drive signal of the gate line drive module at the same time, when a disconnection defect occurs in the gate line in one pair of gate line and gate line redundancy line corresponding to one another, the first control switch can be activated, and thus, the gate line is connected with the other end of the gate line redundancy line and electrically communicated with the gate line redundancy line, the drive signal of the gate line drive module can be transmitted to the other end of the gate line through the gate line redundancy line, and thus it is ensured that pixels after a disconnection point of the gate line with the disconnection defect can also normally obtain the drive signal from the gate line drive module; likewise, the data line redundancy lines and the data lines of a data line layer are in a one-to-one correspondence relationship and can obtain the drive signal of the data line drive module at the same time, when a disconnection defect occurs in the data line in one pair of data line and data line redundancy line corresponding to one another, the second control switch can be activated, and thus, the data line is connected with the other end of the data line redundancy line and electrically communicated with the data line redundancy line, the drive signal of the data line drive module can be transmitted to the other end of the data line through the data line redundancy line, and thus it is ensured that pixels after a disconnection point of the data line with the disconnection defect can also normally obtain the drive signal from the data line drive module, and thereby, a normal displaying of a display panel is ensured.

Because each of the data line redundancy lines and each of the gate line redundancy lines are used as backup lines of each of the data lines and each of the gate lines, respectively, in a condition that a disconnection effect occurs in one of the data lines, the corresponding data line redundancy line can used to repair the data line, and in a condition that a disconnection effect occurs in one of the gate lines, the corresponding gate line redundancy line can used to repair the gate line. And, there is a very low rate for disconnection effects simultaneously occurring in both of the corresponding data line and data line redundancy line and in both of the corresponding gate line and the gate line redundancy line, and thus, the success rate of repairing a large-sized screen is high.

Therefore, for the display panel provided by embodiments of the present invention, a disconnection effect on the array substrate can be repaired satisfactorily through the disposed gate line redundancy lines and the data line redundancy lines.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A display panel, comprising an array substrate, and the array substrate comprising:

a plurality of gate lines and a plurality of data lines each intersecting each of the plurality of data lines, each of the gate lines being connected with a gate driving module, and each of the data lines being connected with a data driving module;

a plurality of gate line redundancy lines, being in a one-to-one correspondence relationship with the plurality of gate lines, and each of the gate line redundancy lines receiving a same gate signal as the corresponding gate line, and being connected with the gate driving module at a first one end and with a corresponding gate line at a first another end through a first control switch; and a plurality of data line redundancy lines, being in a one-to-one correspondence relationship with the plurality of data lines, and each of the plurality of data line redundancy lines receiving a same data signal as the corresponding data line, and being connected with the data driving module at a second one end and with a corresponding data line at a second another end through a second control switch, wherein, the first control switch controls the connection and disconnection between the gate line redundancy line and its corresponding gate line, and the second control switch controls the connection and disconnection between the data line redundancy line and its corresponding data line, the display panel further comprises: a color filter substrate, wherein, the color filter substrate is cell-assembled with the array substrate, the gate line redundancy lines and the data line redundancy lines are respectively disposed at different sides of the array substrate from respective corresponding gate lines and data lines, and the gate line redundancy lines and the data line redundancy lines are located at a side of the array substrate facing away from the color filter substrate.

2. The display panel according to claim 1, wherein, each of the gate line redundancy lines is electrically connected with its corresponding first control switch through a first flexible circuit board, and each of the data line redundancy lines is electrically connected with its corresponding second control switch through a second flexible circuit board; or, each of the gate lines is electrically connected with its corresponding first control switch through the first flexible circuit board, and each of the data lines is electrically connected with its corresponding second control switch through the second flexible circuit board.

3. The display panel according to claim 1, wherein, the gate line redundancy lines and the data line redundancy lines are formed of an anisotropic conductive adhesive.

4. The display panel according to claim 1, wherein, the array substrate is further provided with:
- a first signal line for providing a first conversion signal to the first control switch; and
- a second signal line for providing a second conversion signal to the second control switch.

* * * * *